United States Patent
Cohen

(10) Patent No.: US 10,429,479 B2
(45) Date of Patent: Oct. 1, 2019

(54) RAPID MEASUREMENT OF PERFUSION USING OPTIMIZED MAGNETIC RESONANCE FINGERPRINTING

(71) Applicant: The General Hospital Corporation, Boston, MA (US)

(72) Inventor: Ouri Cohen, Teaneck, NJ (US)

(73) Assignee: The General Hospital Corporation, Boston, MA (US)

(*) Notice: Subject to any disclaimer, the term of this patent is extended or adjusted under 35 U.S.C. 154(b) by 355 days.

(21) Appl. No.: 15/481,977

(22) Filed: Apr. 7, 2017

(65) Prior Publication Data

US 2017/0299683 A1 Oct. 19, 2017

Related U.S. Application Data

(60) Provisional application No. 62/324,516, filed on Apr. 19, 2016.

(51) Int. Cl.
*G01V 3/00* (2006.01)
*G01R 33/563* (2006.01)
*G01R 33/56* (2006.01)
*G01R 33/561* (2006.01)
*G01R 33/48* (2006.01)

(52) U.S. Cl.
CPC ..... *G01R 33/56366* (2013.01); *G01R 33/482* (2013.01); *G01R 33/4828* (2013.01); *G01R 33/5601* (2013.01); *G01R 33/5616* (2013.01); *G01R 33/56308* (2013.01)

(58) Field of Classification Search
CPC .............................. G01R 33/56366
USPC ................................ 324/309, 307
See application file for complete search history.

(56) References Cited

U.S. PATENT DOCUMENTS

| 10,076,264 B2* | 9/2018 | Brady-Kalnay ....... A61B 5/055 |
| 2015/0297101 A1 | 10/2015 | Hernandez-Garcia et al. |
| 2016/0025835 A1* | 1/2016 | Gulani ............... G01R 33/5635 600/420 |
| 2016/0278661 A1* | 9/2016 | Griswold ............... A61B 5/055 |
| 2017/0276753 A1* | 9/2017 | Cohen ..................... G01R 33/50 |

FOREIGN PATENT DOCUMENTS

WO 2015160400 A2 10/2015

OTHER PUBLICATIONS

Detre et al, "Perfusion Imaging," MRM 23:37-45 (1992).
Kwong et al, "MR Perfusion Studies with T1-weighted Echo Planar Imaging," MRM 34:878-887(1995).

* cited by examiner

Primary Examiner — Louis M Arana
(74) Attorney, Agent, or Firm — Quarles & Brady LLP

(57) ABSTRACT

Described here are systems and methods for generating quantitative perfusion parameter maps based on different longitudinal relaxation parameter maps that are produced from images acquired using non-selective and selective magnetic resonance imaging ("MRI") data acquisition techniques.

9 Claims, 2 Drawing Sheets

RAPID MEASUREMENT OF PERFUSION USING OPTIMIZED MAGNETIC RESONANCE FINGERPRINTING

CROSS-REFERENCE TO RELATED APPLICATIONS

This application claims the benefit of U.S. Provisional Patent Application Ser. No. 62/324,516, filed on Apr. 19, 2016, and entitled "RAPID MEASUREMENT OF PERFUSION USING OPTIMIZED MAGNETIC RESONANCE FINGERPRINTING."

BACKGROUND

Multiple methods can be used to measure perfusion in vivo. Some of the common methods include dynamic susceptibility contrast ("DSC") magnetic resonance imaging ("MRI"), dynamic contrast enhancement ("DCE") MRI, and arterial spin labeling ("ASL").

One significant disadvantage of DSC-MRI and DCE-MRI is the need for administering a contrast agent to the subject. On the other hand, ASL does not require the use of a contrast agent and is therefore non-invasive. However, ASL suffers from inherently low signal-to-noise ratio ("SNR") and poor temporal resolution, which require lengthened scan times to address. Therefore, while ASL provides a non-invasive measurement of perfusion, it is not a rapid imaging method.

Thus, there remains a need for a rapid and non-invasive technique for measuring perfusion in vivo.

SUMMARY OF THE DISCLOSURE

The present disclosure addresses the aforementioned drawbacks by providing method for using a magnetic resonance imaging ("MRI") system to estimate quantitative perfusion parameters of a subject. Optimized acquisition parameters are estimated. These acquisition parameters are optimized to direct the MRI system to generate a plurality of different signal evolutions that maximize discrimination between different magnetic resonance relaxation parameters in a minimized number of repetition time ("TR") periods. Data are acquired with the MRI system by directing the MRI system to perform a plurality of pulse sequences using the optimized acquisition parameters. These data represent the plurality of different signal evolutions. Longitudinal relaxation parameters are estimated by comparing the acquired data with a dictionary database comprising a plurality of different signal evolution templates. Quantitative perfusion parameters are then computed based on the longitudinal relaxation parameters.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
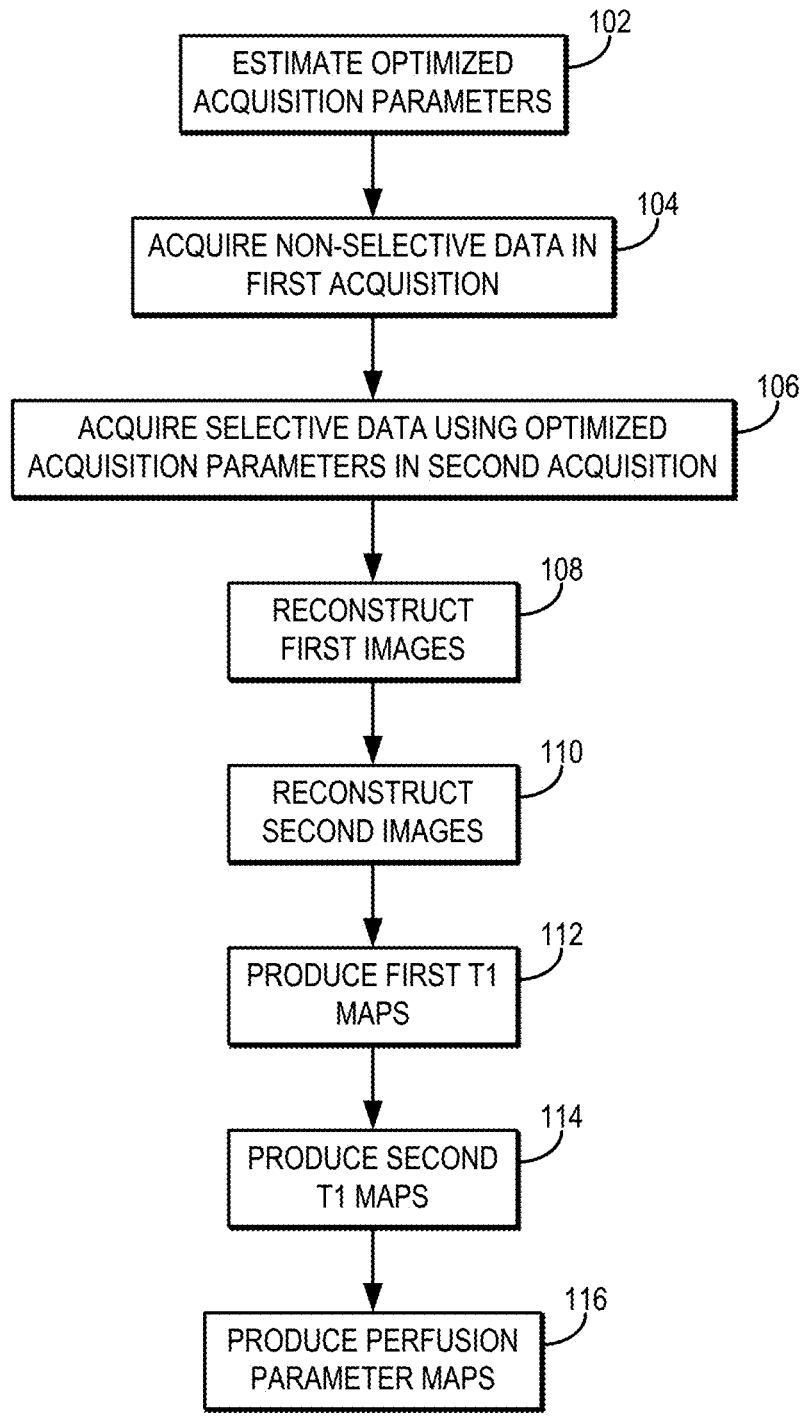
FIG. 1 is a flowchart setting forth the steps of an example of a method for estimating quantitative perfusion parameters from estimated longitudinal relaxation parameters.

Described here are systems and methods for generating quantitative perfusion parameter maps based on longitudinal relaxation parameter maps that are produced from images acquired using magnetic resonance imaging ("MRI") techniques. In particular, the systems and methods described here implement an MRI scan that acquires data in two different acquisitions, from which a measurement of longitudinal relaxation can be estimated. Based on the specific data acquisition, blood flow and other perfusion parameters can be estimated from the measured longitudinal relaxation.

The systems and methods described here allow for rapid and non-invasive quantification of perfusion. Because the methods described here do not rely on the signal difference between the magnitudes of tag and control images, the achievable signal-to-noise ratio ("SNR") will be intrinsically higher than conventional perfusion imaging techniques. Transverse relaxation parameters can also be simultaneously quantified, which can then be used to eliminate potentially confounding factors (e.g., the BOLD effect) from the perfusion parameter estimation.

The systems and methods described in the present disclosure overcome the drawbacks of previous arterial spin labeling ("ASL") based perfusion imaging techniques by utilizing an optimized magnetic resonance fingerprinting ("MRF") technique to produce longitudinal relaxation parameter maps from two different data acquisitions. These longitudinal relaxation maps can then be used as the basis for calculating blood flow, from which other quantitative perfusion parameters can be estimated.

In general, MRF techniques utilize a data acquisition scheme that causes signals from different materials or tissues to be spatially and temporally incoherent by continuously varying acquisition parameters throughout the data acquisition process. Examples of acquisition parameters that can be varied include flip angle ("FA"), radio frequency ("RF") pulse phase, repetition time ("TR"), echo time ("TE"), and sampling patterns, such as by modifying readout encoding gradients. In typical MRF approaches, the acquisition parameters are generally varied in a pseudorandom manner.

As a result of the spatial and temporal incoherence imparted by an acquisition scheme utilizing multiple parameter values, each material or tissue is associated with a unique signal evolution or "fingerprint," that is a function of multiple different physical parameters, including longitudinal relaxation time, $T_1$; transverse relaxation time, $T_2$; main magnetic field map, $B_0$; and proton density, $\rho$.

Quantitative parameter maps are then generated from the acquired signals based on a comparison of the signals to a predefined dictionary of predicted signal evolutions. Each of these dictionaries is associated with different combinations of materials and acquisition parameters. As an example, the comparison of the acquired signals to a dictionary can be performed using any suitable matching or pattern recognition technique. This comparison results in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

In the systems and methods described here, an optimized schedule of acquisition parameters (e.g., FA, TR) is generated based on anatomical $T_1$ values, $T_2$ values, or both. This optimization maximizes discrimination between signal magnetization from different tissues, and in turn drastically reduces the number of measurements required to produce longitudinal relaxation maps from which quantitative perfusion parameter maps can be produced. In combination with a modified echo-planar-imaging ("EPI") pulse sequence, the optimized sequence is capable of yielding longitudinal relaxation maps in about 1.6 seconds per slice.

Referring now to FIG. 1, a flowchart is illustrated as setting forth the steps of one non-limiting example method for producing a quantitative map of a perfusion parameter from data acquired using acquisition parameters that have been selected to reduce the number of acquisitions necessary to desirably sample the relaxation parameter space. The method begins by generating a vector, or schedule, of acquisition parameters that has been selected (or, as a non-limiting example, optimized) to reduce the number of acquisitions necessary to sufficiently sample the relaxation parameter space, as indicated at step 102.

By way of example, the selection or optimization of acquisition parameters, such as FA and TR, may include providing an initial, randomly-generated seed vector of the acquisition parameters to be selected or optimized. This seed vector may have a length, N, and may be used to simulate the signal for a range, P, of relaxation parameters. As mentioned above, the systems and methods described in the present disclosure include quantifying $T_1$; thus, a range, P, of $T_1$ values can be used. The seed vector and simulated relaxation parameters are used to form an N×P matrix, A. This matrix, A, can then be used to calculate a dot product matrix, $$D = A^T A \qquad (1).$$

The diagonal elements of this dot product matrix, D, indicate the closeness of a match between a schedule resulting from a given relaxation parameter (e.g., $T_1$) and itself. The diagonal elements are, therefore, equal to one. The off-diagonal elements of the dot product matrix, D, however, indicate the quality of matching between every two different elements of the matrix, A. Discriminating between Ti and $T_2$ values in the matching process requires that the dot product of a measured trajectory with the pre-computed trajectory that is stored in the dictionary be high for the correct $T_1$ and $T_2$ values and, ideally, zero for all others. To find the vector of acquisition parameters (e.g., TRs and FAs) that yield this optimum value, or a value that is otherwise sufficiently desirable, a model can be utilized. One non-limiting example of a model is the following optimization problem:

$$\min_x f(x) \text{ such that } \sum_{i \neq j} D_{ij}(x) - \lambda \sum_{i=j} D_{ij}(x); \qquad (2)$$

where f(x) is the function to simulate the schedule and compute the dot product matrix, D, given a vector, x, of acquisition parameters. A penalty term, λ, is applied as well to avoid minimizing the on-diagonal elements. Another non-limiting example of a model that can be used is:

$$\min_x f(x) = \frac{\sum_{i \neq j} D_{ij}(x)}{\sum_{i=j} D_{ij}(x)}; \qquad (3)$$

where the ratio of off-diagonal to diagonal elements is minimized. Another non-limiting example of a model than can be used is the following:

$$\min_x \|I - D(x)\|_F^2; \qquad (4)$$

where x represents the acquisition schedule and ‖ . . . ‖ is the Frobenius norm. As one example, a constrained nonlinear solver can be used to solve Eqns. (2), (3), or (4).

Using the optimized schedule reduces the total number of acquisitions needed to sufficiently sample the physical parameter space, but also samples this physical parameter space in a manner that increases the discrimination between different parameters, thereby reducing the scan time required to perform MRF. Additional time savings can be achieved by using rapid data acquisition schemes, such as EPI and segmented EPI.

Referring again to FIG. 1, the method for estimating perfusion parameters continues by acquiring data by directing an MRI system to perform pulse sequences in first and second data acquisitions, as indicated at steps 104 and 106, respectively. The pulse sequences can include any suitable pulse sequence for obtaining MRF data, but in some embodiments the pulse sequence used can be an EPI pulse sequence, which may be a spin-echo ("SE") EPI sequence or a gradient-recalled echo ("GRE") EPI sequence. Multiple pulse sequences can be performed in each of the first and second acquisitions, wherein scan parameter values for each pulse sequence can vary from one excitation to the next. In some aspects, TR, FA, and other parameter values may be varied in accordance with optimized or desired trajectories, such as those described above; in a random manner; or in a pseudorandom manner. The parameters can be varied sequentially, simultaneously, or in accordance with a differential sensitivity requirement for specific parameters of interest.

Blood flow in a tissue can be modeled as a change in the "true" longitudinal relaxation time, $T_1$, of a tissue. This effect is exploited to calculate the blood flow by rapidly measuring the $T_1$ in a given voxel using two different acquisitions to exploit differences in $T_1$.

In the first acquisition, performed at step 104, the spin magnetization is initially inverted using a non-selective radio frequency ("RF") inversion pulse. Because the RF pulse is non-selective, it inverts the spin magnetization in the entire sample, desensitizing it to flow.

In the second acquisition, performed at step 106, the initial RF inversion pulse is made slice-selective rather than non-selective. In some embodiments, optimized acquisition parameters are used for both the first and second acquisitions; however, in some other embodiments optimized acquisition parameters may be used for only the second acquisition. Because the optimized sequence requires only a small number of measurements, the total scan time for the optimized acquisitions is short (e.g., 2-4 seconds per slice).

First images are reconstructed from the non-selective data acquired using the first acquisition, as indicated at step 108, and second images are reconstructed from the selective data acquired using the second acquisition, as indicated at step 110. First $T_1$ maps are then estimated by comparing the first images to a pre-computed dictionary, as indicated at step 112, and second $T_1$ maps are estimated by comparing the second images to a pre-computed dictionary, as indicated at step 114. In some instances, the same pre-computed dictionary can be used in both steps 112 and 114; however, in other instances different pre-computed dictionaries can be used for these steps. Conventional matching algorithms can be used; however, in some configurations, an adaptive matching algorithm, such as the one described in co-pending PCT Application No. PCT/US15/11948, which is herein incorporated by reference in its entirety, can also be used.

Blood flow is then estimated based on the first and second $T_1$ maps, as indicated at step 116. In the selective case, fresh non-inverted spins flowing into the slice will manifest as a difference in the $T_1$ value for the given voxel that is proportional to the flow. The difference between the $T_1$ values calculated from each acquisition can thus be related to the flow through the following equation:

$$\frac{1}{T_{1a}} = \frac{1}{T_1} + \frac{f}{\lambda}; \quad (5)$$

where $T_{1a}$ is the "apparent" $T_1$, f is the flow, and $\lambda$ is the blood-tissue water partition coefficient. Because the methods described here use estimated $T_1$ values rather than signal magnitudes, the methods are intrinsically less sensitive to SNR compared to traditional ASL.

If the sequence is used to measure neuronal activation (e.g., in an fMRI scan), the increased blood flow associated with that neuronal activation causes an increase in oxygen supply to the tissue through the BOLD effect. This increase in oxygen shortens the $T_1$, which if not accounted for will appear as an incorrect flow. By measuring the BOLD signal simultaneously, the $T_1$ changes that are due to changes in the oxygen concentration rather than the flow can be measured and used to compensate the estimated flow. To this end, $T_2^*$ maps can also be obtained and used to account for the potentially confounding BOLD effect on the flow.

Figure 2:
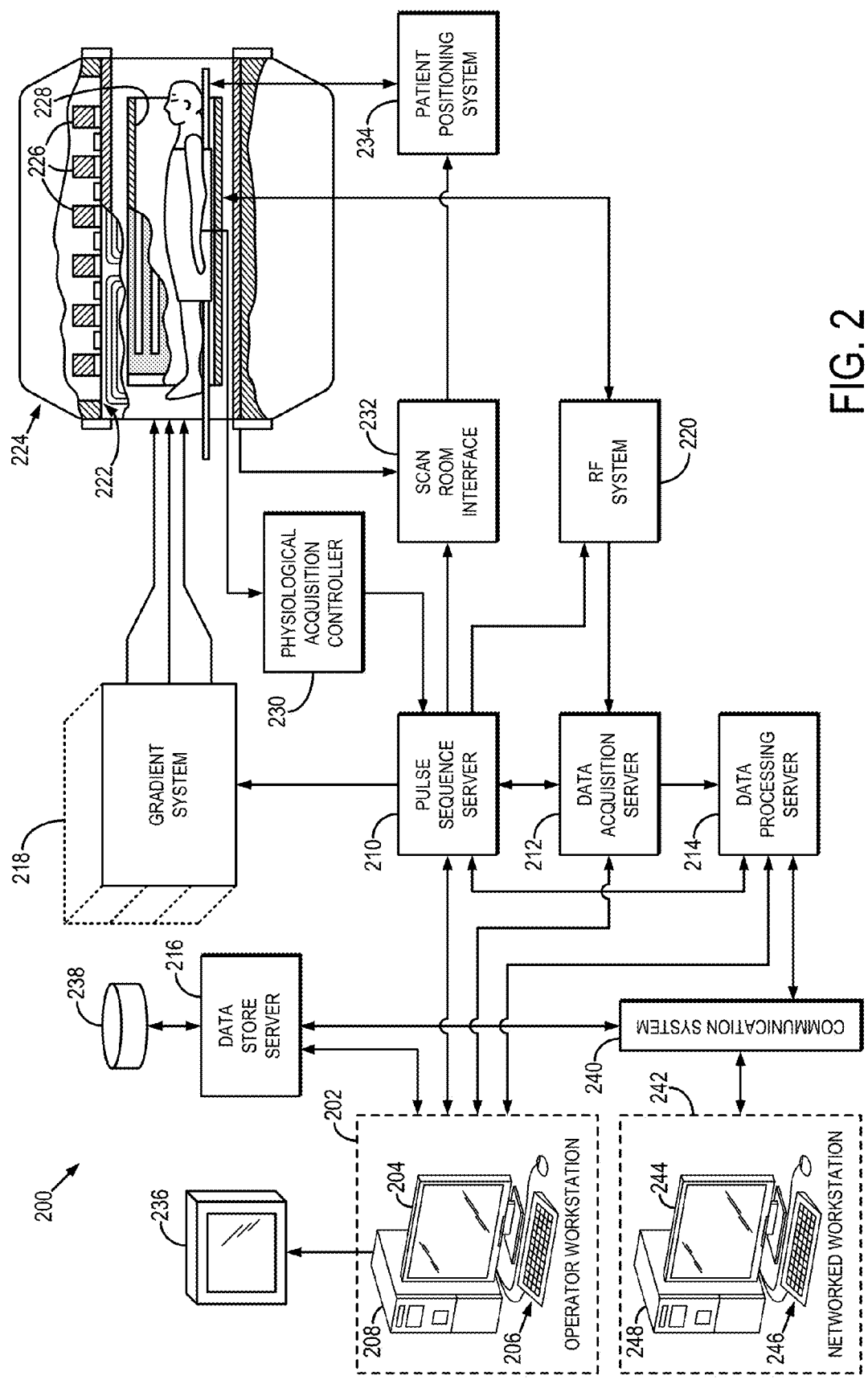
FIG. 2 is a block diagram of an example magnetic resonance imaging (MRI) system that can implement methods described here.

Referring particularly now to FIG. 2, an example of a magnetic resonance imaging ("MRI") system 200 that can implement the methods described here is illustrated. The MRI system 200 includes an operator workstation 202 that may include a display 204, one or more input devices 206 (e.g., a keyboard, a mouse), and a processor 208. The processor 208 may include a commercially available programmable machine running a commercially available operating system. The operator workstation 202 provides an operator interface that facilitates entering scan parameters into the MRI system 200. The operator workstation 202 may be coupled to different servers, including, for example, a pulse sequence server 210, a data acquisition server 212, a data processing server 214, and a data store server 216. The operator workstation 202 and the servers 210, 212, 214, and 216 may be connected via a communication system 240, which may include wired or wireless network connections.

The pulse sequence server 210 functions in response to instructions provided by the operator workstation 202 to operate a gradient system 218 and a radiofrequency ("RF") system 220. Gradient waveforms for performing a prescribed scan are produced and applied to the gradient system 218, which then excites gradient coils in an assembly 222 to produce the magnetic field gradients $G_x$, $G_y$, and $G_z$ that are used for spatially encoding magnetic resonance signals. The gradient coil assembly 222 forms part of a magnet assembly 224 that includes a polarizing magnet 226 and a whole-body RF coil 228.

RF waveforms are applied by the RF system 220 to the RF coil 228, or a separate local coil to perform the prescribed magnetic resonance pulse sequence. Responsive magnetic resonance signals detected by the RF coil 228, or a separate local coil, are received by the RF system 220. The responsive magnetic resonance signals may be amplified, demodulated, filtered, and digitized under direction of commands produced by the pulse sequence server 210. The RF system 220 includes an RF transmitter for producing a wide variety of RF pulses used in MRI pulse sequences. The RF transmitter is responsive to the prescribed scan and direction from the pulse sequence server 210 to produce RF pulses of the desired frequency, phase, and pulse amplitude waveform. The generated RF pulses may be applied to the whole-body RF coil 228 or to one or more local coils or coil arrays.

The RF system 220 also includes one or more RF receiver channels. An RF receiver channel includes an RF preamplifier that amplifies the magnetic resonance signal received by the coil 228 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \quad (6);$$

and the phase of the received magnetic resonance signal may also be determined according to the following relationship:

$$\varphi = \tan^{-1}\left(\frac{Q}{I}\right). \quad (7)$$

The pulse sequence server 210 may receive patient data from a physiological acquisition controller 230. By way of example, the physiological acquisition controller 230 may receive signals from a number of different sensors connected to the patient, including electrocardiograph ("ECG") signals from electrodes, or respiratory signals from a respiratory bellows or other respiratory monitoring devices. These signals may be used by the pulse sequence server 210 to synchronize, or "gate," the performance of the scan with the subject's heart beat or respiration.

The pulse sequence server 210 may also connect to a scan room interface circuit 232 that receives signals from various sensors associated with the condition of the patient and the magnet system. Through the scan room interface circuit 232, a patient positioning system 234 can receive commands to move the patient to desired positions during the scan.

The digitized magnetic resonance signal samples produced by the RF system 220 are received by the data acquisition server 212. The data acquisition server 212 operates in response to instructions downloaded from the operator workstation 202 to receive the real-time magnetic resonance data and provide buffer storage, so that data is not lost by data overrun. In some scans, the data acquisition server 212 passes the acquired magnetic resonance data to the data processor server 214. In scans that require information derived from acquired magnetic resonance data to control the further performance of the scan, the data acquisition server 212 may be programmed to produce such information and convey it to the pulse sequence server 210. For example, during pre-scans, magnetic resonance data may be acquired and used to calibrate the pulse sequence performed by the pulse sequence server 210. As another example, navigator signals may be acquired and used to adjust the operating parameters of the RF system 220 or the gradient system 218, or to control the view order in which k-space is sampled. In still another example, the data acquisition server 212 may also process magnetic resonance signals used to detect the arrival of a contrast agent in a magnetic resonance angiography ("MRA") scan. For example, the data acquisition server 212 may acquire magnetic resonance data and processes it in real-time to produce information that is used to control the scan.

The data processing server 214 receives magnetic resonance data from the data acquisition server 212 and processes the magnetic resonance data in accordance with instructions provided by the operator workstation 202. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 214 are conveyed back to the operator workstation 202 for storage. Real-time images may be stored in a data base memory cache, from which they may be output to operator display 202 or a display 236. Batch mode images or selected real time images may be stored in a host database on disc storage 238. When such images have been reconstructed and transferred to storage, the data processing server 214 may notify the data store server 216 on the operator workstation 202. The operator workstation 202 may be used by an operator to archive the images, produce films, or send the images via a network to other facilities.

The MRI system 200 may also include one or more networked workstations 242. For example, a networked workstation 242 may include a display 244, one or more input devices 246 (e.g., a keyboard, a mouse), and a processor 248. The networked workstation 242 may be located within the same facility as the operator workstation 202, or in a different facility, such as a different healthcare institution or clinic.

The networked workstation 242 may gain remote access to the data processing server 214 or data store server 216 via the communication system 240. Accordingly, multiple networked workstations 242 may have access to the data processing server 214 and the data store server 216. In this manner, magnetic resonance data, reconstructed images, or other data may be exchanged between the data processing server 214 or the data store server 216 and the networked workstations 242, such that the data or images may be remotely processed by a networked workstation 242.

The present disclosure has described one or more preferred embodiments, and it should be appreciated that many equivalents, alternatives, variations, and modifications, aside from those expressly stated, are possible and within the scope of the invention.

The invention claimed is:

1. A method for using a magnetic resonance imaging (MRI) system to estimate quantitative perfusion parameters of a subject that has been administered a contrast agent, the steps of the method comprising:
   (a) acquiring non-selective data from a subject with the MRI system by directing the MRI system to perform a plurality of pulse sequences that each include a non-selective radio frequency (RF) inversion pulse that inverts spin magnetization in a volume-of-interest that includes at least one slice, the acquired non-selective data representing a plurality of different signal evolutions;
   (b) acquiring selective data from a subject with the MRI system by directing the MRI system to perform a plurality of pulse sequences that each include a selective RF inversion pulse that inverts spin magnetization only in a slice in the volume-of-interest, the acquired selective data representing a plurality of different signal evolutions;
   (c) estimating first longitudinal relaxation parameters from the non-selective data by comparing the non-selective data with a dictionary database comprising a plurality of different signal evolution templates;
   (d) estimating second longitudinal relaxation parameters from the selective data by comparing the selective data with a dictionary database comprising a plurality of different signal evolution templates; and
   (e) computing quantitative perfusion parameters based on a difference between the first and second longitudinal relaxation parameters.

2. The method as recited in claim 1, further comprising estimating optimized acquisition parameters that are optimized to direct the MRI system to generate a plurality of different signal evolutions that maximize discrimination between longitudinal relaxation parameters in a minimized number of repetition time (TR) periods, and wherein the selective data are acquired using the optimized acquisition parameters.

3. The method as recited in claim 2, wherein the non-selective data are acquired using the optimized acquisition parameters.

4. The method as recited in claim 1, wherein the first and second longitudinal relaxation parameters include at least one of longitudinal relaxation time ($T_1$) or longitudinal relaxation rate ($R_1$).

5. The method as recited in claim 1, wherein step (e) includes computing a blood flow.

6. The method as recited in claim 1, wherein step (b) includes acquiring the selective data using an echo-planar imaging (EPI) pulse sequence that samples k-space during each of a plurality of different repetition time (TR) periods and such that the selective data acquired during each TR period represents a plurality of different signal evolutions acquired using different acquisition parameter settings.

7. The method as recited in claim 6, wherein the EPI pulse sequence samples k-space along a Cartesian trajectory.

8. The method as recited in claim 6, wherein the EPI pulse sequence samples k-space by undersampling k-space.

9. The method as recited in claim 6, wherein the EPI pulse sequence is a spin-echo EPI pulse sequence.

* * * * *

UNITED STATES PATENT AND TRADEMARK OFFICE
CERTIFICATE OF CORRECTION

PATENT NO. : 10,429,479 B2  
APPLICATION NO. : 15/481977  
DATED : October 1, 2019  
INVENTOR(S) : Ouri Cohen Page 1 of 1

It is certified that error appears in the above-identified patent and that said Letters Patent is hereby corrected as shown below:

In the Specification

Column 3, Line 41, "$T_i$" should be --$T_1$--.

Signed and Sealed this  
Nineteenth Day of November, 2019

Andrei Iancu  
*Director of the United States Patent and Trademark Office*